United States Patent
Kimura

Patent Number: 5,406,947
Date of Patent: Apr. 18, 1995

[54] MAGNETIC RESONANCE IMAGING APPARATUS

[75] Inventor: Tokunori Kimura, Utsunomiya, Japan

[73] Assignee: Kabushiki Kaisha Toshiba, Kawasaki, Japan

[21] Appl. No.: 970,795

[22] Filed: Nov. 3, 1992

[30] Foreign Application Priority Data

Nov. 5, 1991 [JP] Japan ................................. 3-288284

[51] Int. Cl.$^6$ .............................................. A61B 5/055
[52] U.S. Cl. .................................. 128/653.2; 324/307; 324/309
[58] Field of Search ..................... 324/307, 309, 312; 128/653.2

[56] References Cited

U.S. PATENT DOCUMENTS

| | | | |
|---|---|---|---|
| 4,564,017 | 1/1986 | Glover | 128/653.2 |
| 4,739,766 | 4/1988 | Riederer | 324/309 |
| 4,761,613 | 8/1988 | Hinks | 324/309 |
| 4,896,113 | 1/1990 | Pelc | 324/309 |
| 4,994,744 | 2/1991 | Glover et al. | 324/309 |
| 5,124,649 | 6/1992 | Denison et al. | 324/309 |
| 5,275,163 | 1/1994 | McKinnon et al. | 324/309 X |

Primary Examiner—Lee S. Cohen
Assistant Examiner—Brian L. Casler
Attorney, Agent, or Firm—Limbach & Limbach

[57] ABSTRACT

The MR imaging apparatus for quantifying a microscopic motion in a tissue of a patient comprises a magnet, a gradient coil, a gradient power source, an RF coil, an RF coil, a transmitter, a receiver, a sequencer and a computer system. The sequencer comprises an encoding variable circuit for varying a number at which same phase encoding gradients are repeatedly applied. The encoding variable circuit preferably varies a number of applying so that a number of applying around the phase encoding gradient zero is more than a number of applying out the phase encoding gradient zero. The computer system comprises a sampling circuit for sampling the echo data as multiple echo data by each phase encoding gradient. The computer system further comprises an averaging circuit for averaging the multiple echo data by each phase encoding gradient and a calculating circuit for calculating a predetermined coeffcient related to the microscopic motion using the averaged echo data. The averaging circuit comprises an averaging variable circuit for varying a number of averages by each phase encoding gradient according to the number of applying. The averaging variable circuit preferably varies a number of averages so that a number of averages around the phase encoding gradient zero is more than a number of averages out the phase encoding gradient zero.

9 Claims, 7 Drawing Sheets

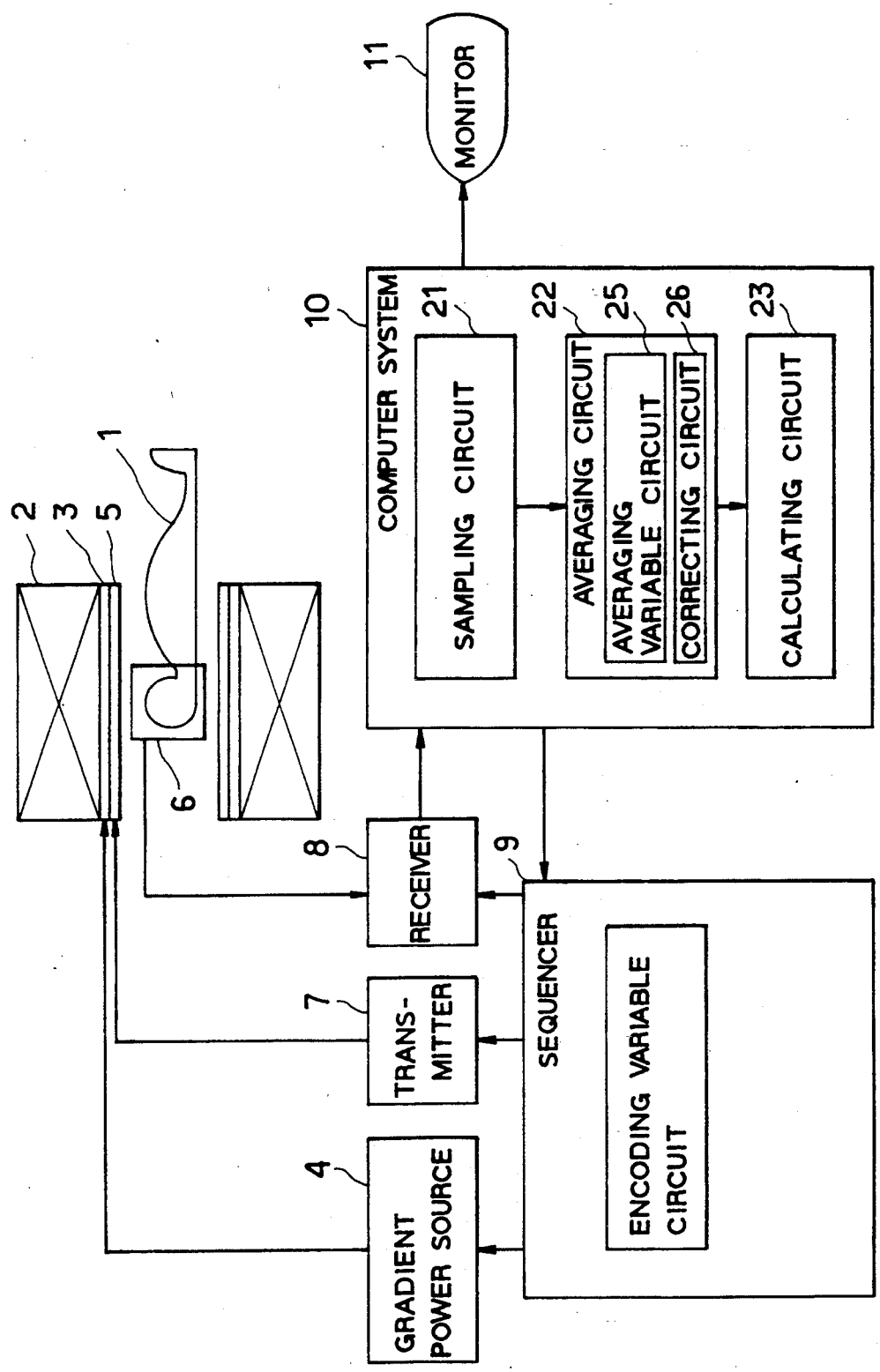
F I G. 1

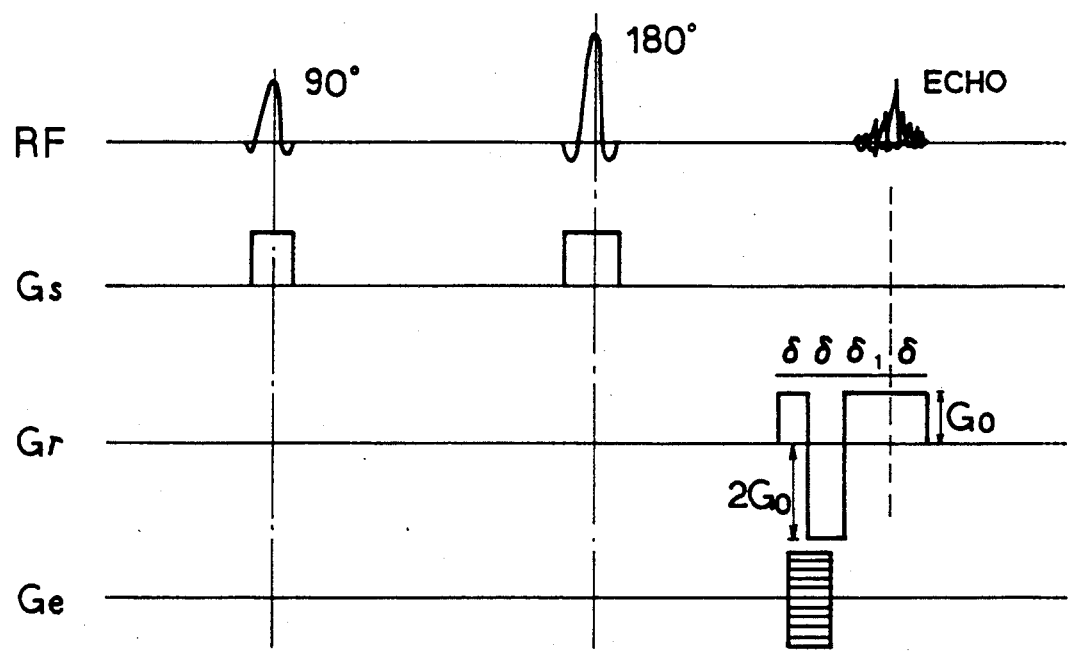
F I G. 8A
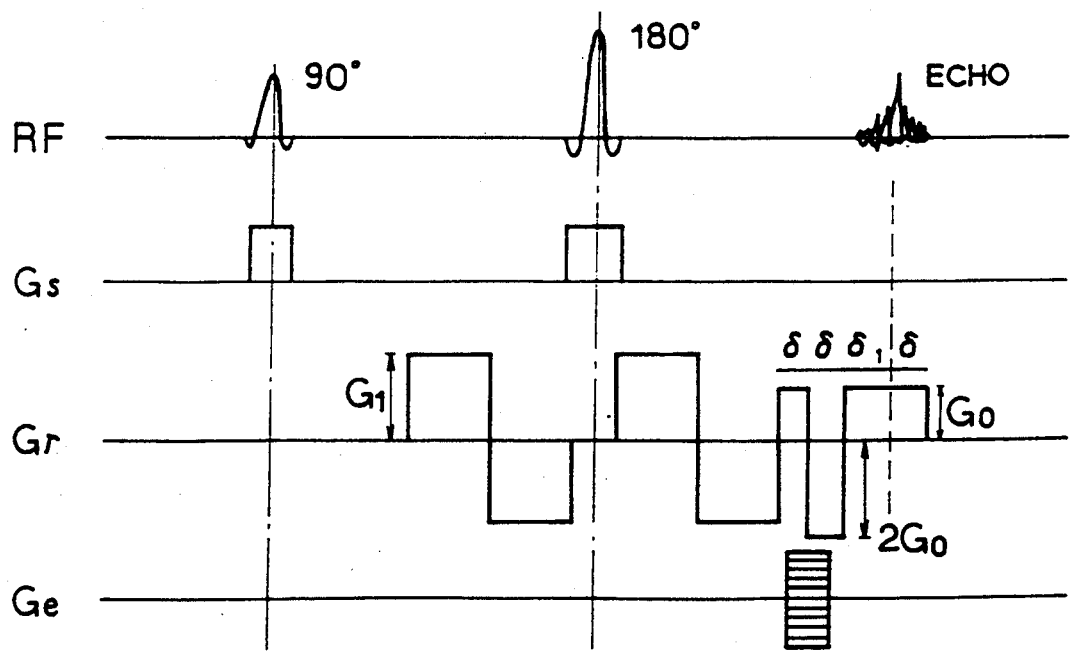
F I G. 8B

MAGNETIC RESONANCE IMAGING APPARATUS

BACKGROUND OF THE INVENTION

This invention relates to magnetic resonance(MR) imaging apparatus. More specifically, this invention relates to a MR imaging apparatus for quantifying a microscopic motion in a tissue of a human body.

As is now well known, the MR phenomenon can be excited within a sample object, such as a human patient, positioned in a homogeneous polarizing magnetic field, by irradiating the object with radio frequency energy at the Larmor frequency.

The technique for quantifying a microscopic motion, especially intravoxel incoherent motion(IVIM) by using MR phenomenon, has worked, for example, by Stejscal E. O., et.al. "Spin diffusion measurement: spin echoes in the presence of time-dependant field gradient" J Chem Phys; 43:288-292, 1965, D. Le Bihan et.al. "MR imaging of Intravoxel Incoherent Motions: Application to diffusion and perfusion in neurologic disorders", Radiology, 161: 401-407, 1986 or "Separation of Diffusion and Perfusion in Intravoxel Incoherent Motion(IVIM) MR imaging", Radiology, 168: 497-505, 1988.

Intravoxel incoherent motion(IVIM) is a term that designates the microscopic translational motions that occur in each image voxel in MR imaging.

In biologic tissues, these motions include molecular diffusion of water and microcirculation of blood in the capillary network(perfusion).

In operation of the MR imaging apparatus for imaging the diffusion or the perfusion, a motion probing gradient(MPG) in large amplitude is applied to a patient so as to probe a micro motion in tissue of the human body of a patient, for example.

When the MPG pulse is applied to the patient, a phase shift does not generate in a static spin of the patient but useful phase shift generates in a moving spin only because of a flow of the moving spin.

Therefore, the phase shift of the moving spin can be emphasized and the diffusion and the perfusion can be quantified.

However, the moving spin includes other spins, for example, a respiratory motion, cardiac motion or a cerebrospinal fluid(CSF) motion.

These moving spins cause the phase shift and therefore a "ghost" or a motion artifact appears in the monitor, which is harmful for the imaging of the diffusion or the perfusion.

To reduce the motion artifact, various imaging methods have developed in the ordinary body imaging, for example, a signal averaging method, an ECG(electrocardiograph) gating method or an EPI(Echo Planar Imaging) method.

The signal averaging is frequently employed in MR imaging to improve signal-to-noise ratio in the body imaging.

However, in the averaging method, acquisition time is directly proportional to the number of averages and so a significant time must be required.

In the ECG method, many electrodes for gating must be attached to a patient body and there must be a long time for preparing the imaging.

Furthermore in a patient having arrhythmia, a repetition time of excitation(TR) are varied and other ghosts may be generated and to a large CSF motion, the ECG method is not effective for reducing the motion artifact.

The EPI method has not seen much usage due to a large number of problems, including hardware problems, such as the large gradient amplifier that must be provided.

Furthermore, a signal which includes the diffusion signal only and does not include the perfusion signal, can not be acquired.

SUMMARY OF THE INVENTION

An object of this invention is to provide an MR imaging apparatus for quantifying a microscopic motion including a diffusion and a perfusion, which can reduce a motion artifact efficiently, which are caused by a respiratory motion, CSF motion or a cardiac motion etc.

Another object of this invention is to provide an MR imaging apparatus for quantifying a microscopic random including a diffusion, which can reduce an effect of a perfusion.

According to this invention, there is provided an MR imaging apparatus for quantifying a microscopic motion in a tissue, comprising:

a magnet means for applying a static magnetic field to the tissue;

a gradient coil means for providing a magnetic gradient which is superimposed on the static magnetic field, the magnetic gradient including a phase encoding gradient;

an RF coil means for transmitting an RF pulse to the tissue and receiving an echo data from the tissue under an application of a predetermined range of the phase encoding gradient;

a sampling means for sampling the echo data as multiple echo data by each phase encoding gradient, the multiple echo data including at least one echo data;

an averaging means for averaging the multiple echo data by each phase encoding gradient;

a calculating means for calculating a predetermined coefficient related to the microscopic motion using the averaged echo data; and a control means for controling said magnet means, said gradient means, said RF coil means, said sampling means, said averaging means and said calculating means.

The control means comprises an encoding variable means for varying a number at which the same phase encoding gradients are repeatedly applied. The averaging means comprises an averaging variable means for varying a number of averages by each phase encoding gradient depending upon the number of phase encoding gradients applied.

In one embodiment, the encoding variable means varies a number of phase encoding gradients applied so that the number applied around the phase encoding gradient zero is more than the number applied outside of the phase encoding gradient zero. The averaging variable means varies a number of averages according to the number applied.

Thus, when the diffusion or the perfusion is quantified, ghost images by respiratory motion etc., can be effectively reduced without extending a total acquisition time since the ghost image is mainly included in lower frequency which corresponds to the phase encoding gradient zero or central views in a k-space.

In another preferred embodiment, the averaging means comprises means for correcting the averaged echo data.

Therefore, the averaged data can be corrected in a predetermined region close to a boundary where the number of averages changes and thus a generation of ringing in a reconstructed image can be obviated efficiently.

According to this invention, there is further provided an MR imaging apparatus for quantifying a diffusion in a tissue, comprising:

a magnet means for applying a static magnetic field to the tissue;

a gradient coil means for providing a magnetic gradient along a slice selecting direction, a readout direction and a phase encoding direction, the magnetic gradient being superimposed on the static magnetic field;

an RF coil means for transmitting an RF pulse to the tissue and receiving an echo data from the tissue under an application of the magnetic gradient;

a sampling means for sampling at least two sets of the echo data;

a calculating means for calculating a predetermined coeffcient related to the diffusion using at least two sets of the echo data; and a control means for controling said magnet means, said gradient means, said RF coil means, said sampling means and said calculating means, wherein said control means controls said gradient coil means to apply a motion probing gradient(MPG) for emphasizing the diffusion and compensating a predetermined microscopic motion, the MPG being applied in at least one of the slice selecting directions, the readout direction and the phase encoding direction and in at least one set of the echo data.

In one preferred embodiment, said calculating means calculates a diffusion coefficient for the tissue using two sets of echo data which are acquired respectively using predetermined MPGs, gradient factors of which have values different from each other.

In a further preferred embodiment, said MPGs are different in at least one of a gradient intensity and an application period.

BRIEF DESCRIPTION OF THE DRAWINGS

For a more complete understanding of this invention reference will be made to the following detailed explanations in conjunction with the accompanying drawing in which:

FIG. 1 is a block diagram showing a preferred embodiment of an MR imaging appratus according to this invention;

FIG. 8A is a timing chart showing the one of two pulse sequences for quantifying the diffusion; and FIG. 8B is a timing chart showing the other pulse sequence.

DESCRIPTION OF THE PREFERRED EMBODIMENTS

Figure 2:
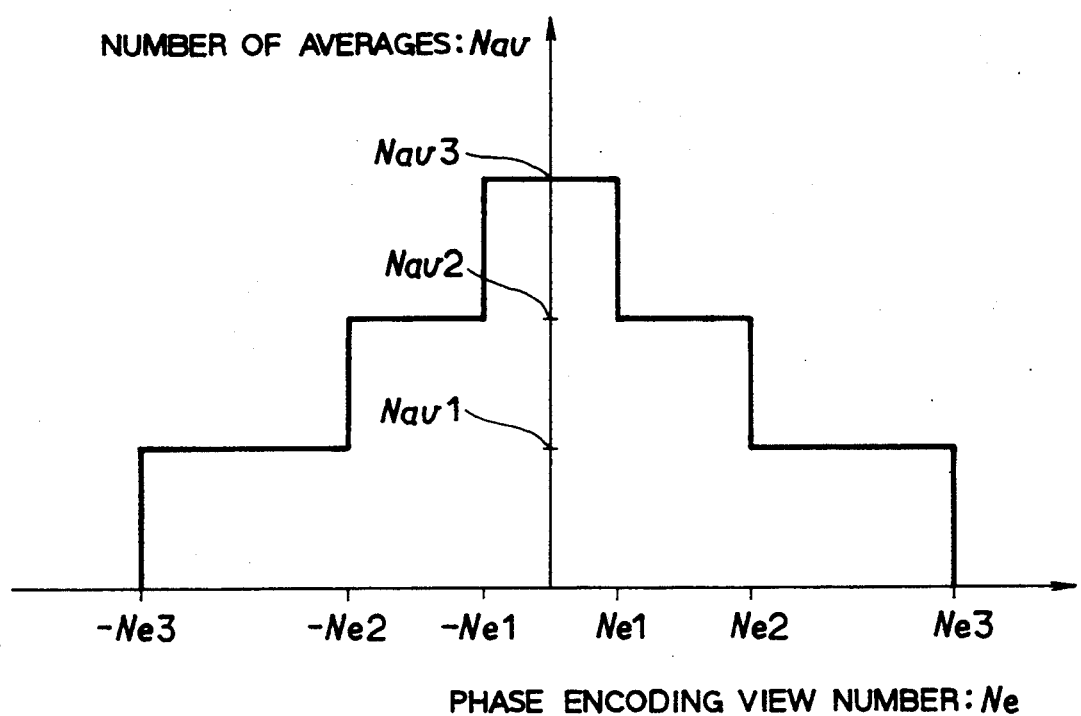
FIG. 2 is a graph showing a relation between phase encoding view number Ne and number of averages Nav.

Referring now to the accompanying drawing, the MR imaging apparatus for quantifying a microscopic motion in a tissue of a patient 1, shown in FIG. 1, comprises a magnet 2 for applying a static magnetic field to the patient 1.

The MR imaging apparatus further comprises a gradient coil for providing magnetic gradients which are superimposed on the static magnetic field and a gradient power source 4 connected to the gradient coil 3.

The magnetic gradients are applied in a slice selecting direction, a readout direction and a phase encoding direction.

The MR imaging apparatus further comprises an RF coil 5 for transmitting an RF pulse to the patient 1, an RF coil 6 receiving an echo data from the patient 1 under an application of the magnetic gradients, a transmitter 7 connected to the RF coil 5 and a receiver 8 connected to the RF coil 6.

The MR imaging apparatus further comprises a sequencer 9 for operating the gradient power source 4, the transmitter 7 and the receiver 8, a computer system 10 for controlling the sequencer 9 and receiving the echo data from the receiver 8 to reconstruct an image and a monitor 11 for displaying the reconstructed image.

The sequencer 9 comprises an encoding variable circuit 24 for varying a number at which same phase encoding gradients are repeatedly applied.

The encoding variable circuits 24 preferably varies the number of phase encoding gradient applied so that the number applied within a range of the phase encoding gradient zero and around zero are more than the number applied of the phase encoding gradient existing outside the range of the phase encoding gradient zero and around zero.

The computer system 10 comprises a sampling circuit 21 for sampling the echo data as multiple echo data by each phase encoding gradient.

The multiple echo data includes at least one echo data.

The computer system 10 further comprises an averaging circuit 22 for averaging the multiple echo data by each phase encoding gradient and a calculating circuit 23 for calculating a predetermined coeffcient related to the microscopic motion using the averaged echo data.

The averaging circuit 22 comprises an averaging variable circuit 25 for varying a number of averages by each phase encoding gradient according to the number of applying.

The averaging variable circuit 25 preferably varies the number of averages so that the average numbers within a range of the phase encoding gradient zero and around zero are more than within further ranges of the phase encoding gradient existing outside the range of the phase encoding gradient zero and around zero.

FIG. 2 is a graph showing a relation between phase encoding view number Ne and number of averages Nav.

In FIG. 2, ky=0 in a k-space corresponds to Ne=0 and number or average Nav for the central view(−Ne1<Ne<Ne1) is Nav3, for the outer view(−Ne2<Ne<−Ne1, Ne1<Ne<Ne2) is Nav2 and for the further outer view(−Ne3<Ne<−Ne2, Ne2<Ne<Ne3) is Nav1.

Now, it is assumed that echo data before averaging are fi(Ne)(i=1,2, ... Nav) and the echo data after averaging are f(Ne) and then a relation between fi(Ne) and f(Ne) is as follows;

$$f(Ne) = [\Sigma fi(Ne)]/Nav$$

Σ designates a summation over i=1,2, ... Nav.

The averaging circuit 22 preferably comprises a correcting circuit 26 for correcting the averaged echo data f(Ne).

In the correcting circuit 26, the averaged data f(Ne) are corrected using a weighting function C(Ne) in a predetermined region close to a boundary where the number of averages varies, for example, the phase encoding view number is −Ne2, −Ne1, Ne1 and Ne2.

The weighting function C(Ne), for example in a boundary where Ne closes to Ne1, is as follows;

$$\begin{aligned}
C(Ne) &= 1 \,(Ne < Ne1 - \Delta N \text{ or } Ne > Ne1 + \Delta N) \\
&= [\{fc(Ne1)/f(Ne\,1^-) - 1\}/\Delta N] \cdot \{Ne - (Ne1 - \Delta N)\} + 1 \\
&\quad (Ne1 - \Delta N < Ne < Ne1) \\
&= [\{1 - fc(Ne1)/f(Ne^+)\}/\Delta N] \cdot (Ne - Ne1) + \\
&\quad fc(Ne1)/f(Ne\,1^+) \\
&\quad (Ne1 < Ne < Ne1 + \Delta N)
\end{aligned}$$

Figure 3A:
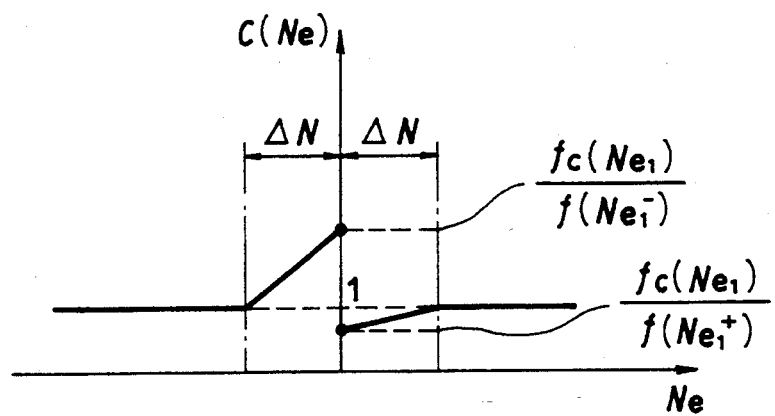
FIG. 3A is a graph showing a weighting function for the correcting process.

FIG. 3A shows the weighting function C(Ne).

In FIG. 3A, ΔN is a predetermined value, f(Ne1⁻) and f(Ne1⁺) designates an averaged echo data before correcting which are close to Ne1 from left hand direction and right hand direction respectively and fc(Ne1) is an averaged echo data at Ne=Ne1 after correcting which can be arbitrarily selected.

For example, fc(Ne1) can be set as follows;

$$fc(Ne1) = \{f(Ne1^-) + f(Ne1^+)\}/2$$

An corrected echo data fc(Ne) is as follows;

$$fc(Ne) = C(Ne) \times f(Ne)$$

Figure 3B:
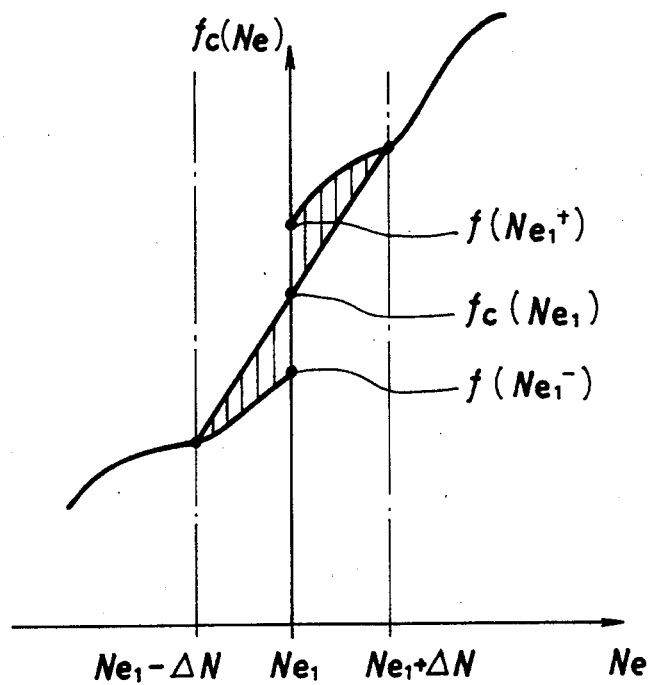
FIG. 3B is a graph showing a corrected averaged data.

FIG. 3B shows the corrected echo data fc(Ne).

Figure 4:
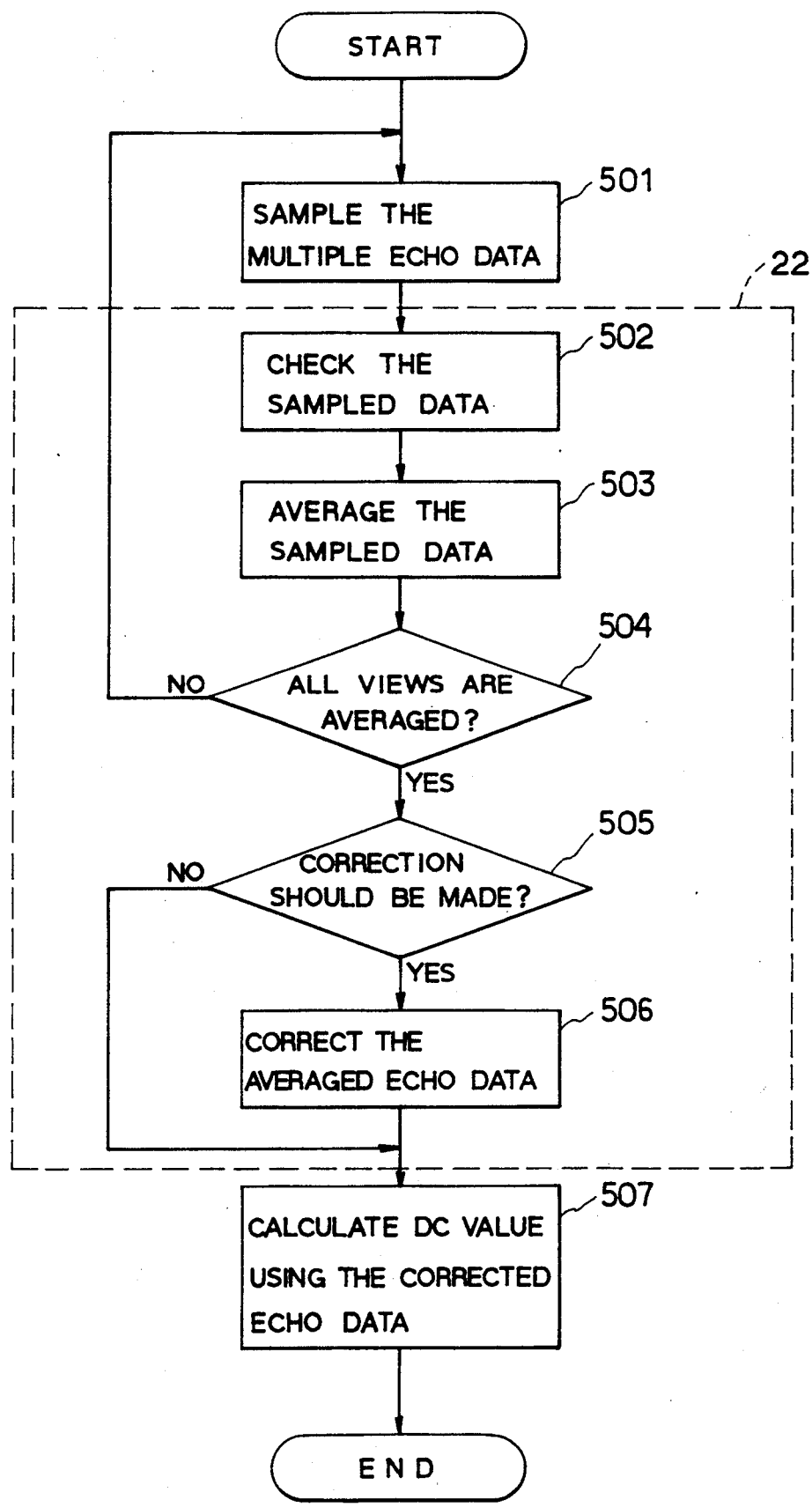
FIG. 4 is a flowchart showing a process for averaging and correcting.

FIG. 4 is a flowchart showing an operation of averaging and correction.

In operation, the multiple echo data are sampled by each phase encoding view in the sampling circuit 21(step 501).

A number of multiple echo data are defined according to each phase encoding view, for example, in FIG. 2, for the view number from −Ne1 to Ne1, a number of multiple echo data is Nav3.

The sampled multiple echo data, then, are checked if the averaging should be made or not(step 502).

If the averaging should be made, then the averaging is made for the sampled multiple echo data in the averaging circuit 22(step 503).

After the averaging are made over all phase encoding views(step 504,yes), if the correction should be made because of ringing(step 505,yes), the averaged echo data is corrected, as shown in FIG. 3(step 506).

Finally, a predetermined coefficient related to the microscopic motion, for example, diffusion coefficient DC is calculated using the corrected echo data in the calculating circuit 23(step 507).

If imaging data are needed, the reconstructed image is acquired by transforming the corrected echo data with 2D-FFT and displayed in the monitor 11.

As previously noted, when the diffusion or the perfusion are quantified, ghost image by respiratory motion etc., can be effectively reduced since the ghost image is mainly included in a lower frequency which corresponds to the phase encoding gradient around zero or central views in a k-space.

Now, a total acquisition time is multiplied a time at 1 view by a number of views(if averaging is made, further must be multiplied a number of averages).

Therefore, if a number of averages in central views increases and a number of averages in outer views decreases with keeping the total number of views, then the motion artifact can be reduced efficiently without extending the total acquisition time.

In other words, a total acquisition time can be shortened with keeping the substantially same signal to noise ratio.

Furthermore, a generation of ringing in a reconstructed image can be obviated efficiently since the averaged data can be corrected in a predetermined region close to a boundary where the number of averages changes.

It will be appreciated that modifications may be made in this invention.

Figure 5:
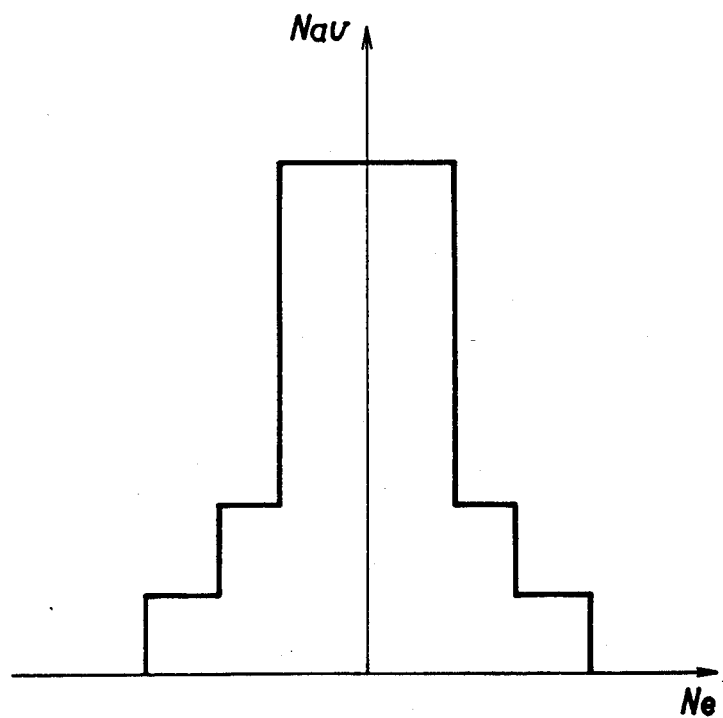
FIG. 5 is a graph showing a modification of the above relation.
Figure 6:
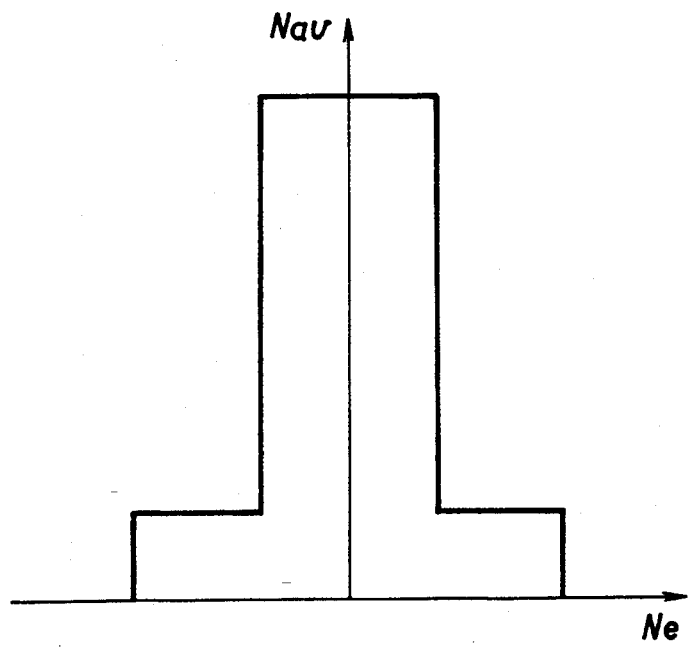
FIG. 6 is a graph showing a modification of the above relation.
Figure 7:
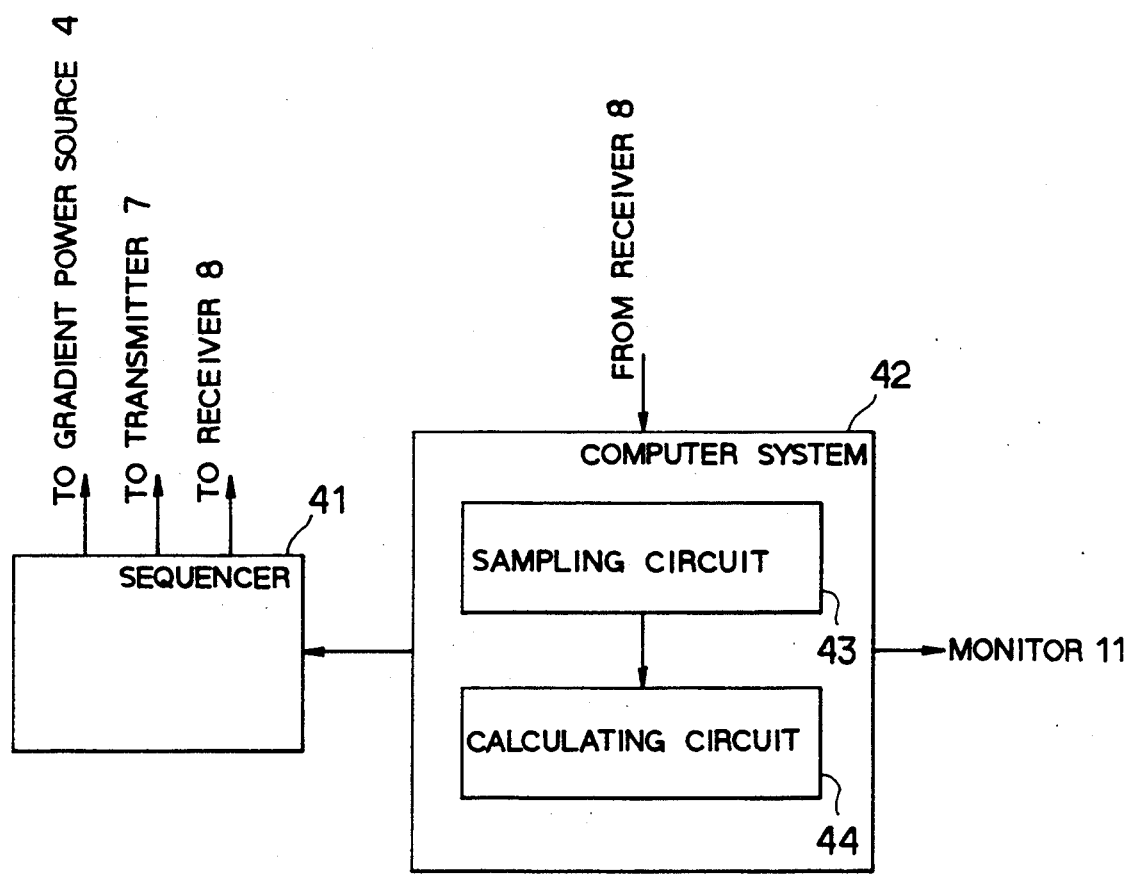
FIG. 7 is a block diagram showing a second embodiment of this invention.

For example, the relation between the phase encoding view number and the number of averages, are not limited to FIG. 2 but, for example, a relation shown in FIG. 5 or FIG. 6 can be used in the averaging.

Furthermore, in the above embodiment, the correction is made, but the correction process can be omitted.

In a second embodiment of this invention, the MR imaging apparatus for quantifying a diffusion in a tissue, comprises the magnet 2, the gradient coil 3, the gradient power source 4, the RF coil 5, the RF coil 6, the transmitter 7, the receiver 8 and monitor 11.

Now, these elements are identical to those shown in FIG. 1 respectively and the detail descriptions are omitted because hereinbefore stated.

The MR imaging apparatus further comprises a sequencer 41 for operating the gradient power source 4, the transmitter 7 and the receiver 8 and a computer system 42 for controlling the sequencer 41 and receiving the echo data from the receiver 8 to reconstruct an image.

The sequencer 41 operates the gradient power source 4 so that two sets of the echo data are sampled.

The computer system 42 controls the sequencer 41 to apply a motion probing gradient(MPG) to the patient 1 for emphasizing a diffusion in a tissue of the patient 1 and compensating a predetermined flow, for example, a flow caused by a perfusion, resperatory motion etc.

The MPG is applied in at least one of the slice selecting direction, the readout direction and the phase encoding direction.

The computer system 42 comprises a sampling circuit 43 for sampling two sets of the data and a calculating circuit 44.

The calculating circuit 44 calculates a diffusion coefficient for the tissue using two sets of echo data which are acquired respectively using different gradient intensity of the MPG.

In operation, an application of the RF pulse and the gradients and a sampling of the two sets of echo data are made according to pulse sequences respectively shown in FIG. 8A and FIG. 8B.

FIG. 8A is a time chart showing a pulse sequence for acquiring the one set of the echo data and FIG. 8B is a time chart showing a pulse sequence for acquiring the other set of the echo data.

As shown in FIG. 8B, the MPG is applied around the application of 180° pulse in the read out gradient.

Now, a gradient factor B is defined as a gradient intensity for diffusing a spin as follows;

$$B = \gamma^2 \int_0^T [\int_0^\tau G(t) dt]^2 d\tau$$

G(t) is an amplitude of the gradient and $\gamma$ is magnetogyric ratio.

The gradient factor B is enough to about 1000 sec/cm$^2$ and thus the G(t) of the MPG preferrably may about 5 gauss/cm.

In the prior art, the dephase gradient was used and thus the gradient factor B could be easily increased but the motion artifact could not be reduced.

However, in the embodiment, the flow rephase gradient is used as MPG and thus the motion artifact can be reduced efficiently.

This gradient amplitude is a little more severe than that of the prior art technique, since the MPG of the embodiment is not a dephase gradient as the prior art but a rephase gradient.

However, the motion artifact can be reduced in the embodiment,

The gradient factor can be calculated according to above equation and it is assumed that the gradient factor in the read out direction of the FIG. 8A and FIG. 8B are B0, B1 (B0<B1) respectively.

After operations according to the two pulse sequences, the two sets of the echo data are sampled in the sampling circuit 43 and it is assumed that the signal amplitudes of the two sets of the echo data in a predetermined same position are S0, S1 respectively.

Then, a diffusion coefficient DC can be calculated in the calculating circuit 44 using the S0, S1 as follows;

$$DC = \{1/(B1 - B0)\} \ln(S0/S1) [\text{mm}^2/\text{sec}]$$

The DC value may be calculated in a predetermined pixel or in pixels within a predetermined ROI(region of interest).

When the calculated DC values are displayed, the DC values can be transformed to the density scale or the color scale by each pixel and displayed in the monitor 11.

As previously noted, when the diffusion is quantified, ghost image can be effectively reduced since the MPG emphasizes a diffusion in a tissue and compensating a predetermined flow, for example, a flow caused by a perfusion, resperatory motion etc.

Therefore, the diffusion can be quantified at less number of averages and thus the total acquisition time can be reduced.

It will be appreciated that modifications may be made in this invention.

For example, in the second embodiment, two sets of the echo data are used for calculating the DC value but a set number of the echo data is not limited to two sets but may be three or more sets of the echo data.

It is assumed that the set number of the echo data is (n+1), the echo data value are S0, S1 ... Sn respectively and the gradient factor are B0, B1 ... Bn, then the DC value can be calculated by curve-fitting using a least square approximation as follows;

$$Sn/S0 = \exp\{-(Bn - B0)DC\}$$

Furthermore, in the second embodiment, the first order MPG is utilized but the second order MPG may be utilized.

Furthermore, in the second embodiment, in both of two pulse sequences, flow rephase pulses are applied in Just before acquiring of echo data and in the other sequence only, a MPG is applied, as shown in FIG. 8B.

However, flow rephase pulses, gradient factors of which have values different from each other, can be applied as MPGs in both of two pulse sequences and the MPG shown in FIG. 8B can be omitted.

Furthermore, the averaging technique of the first embodiment and the MPG technique of the second embodiment, are used independently for quantifying the microscopic motion but both techniques are used simultaneouly.

What is claimed is:

1. A Magnetic resonance imaging apparatus for quantifying a microscopic motion in a tissue, comprising:
    a magnet means for applying a static magnetic field to the tissue;
    a gradient coil means for providing a magnetic gradient superimposed on the static magnetic field, the magnetic gradient including a phase encoding gradient by a phase encoding;
    an RF coil means for transmitting an RF pulse to the tissue and for receiving an echo data to form a multiple echo data from the tissue under an application of a predetermined range of the phase encoding gradient;
    a sampling means for sampling the multiple echo data every time of the phase encoding;
    an encoding variable means for varying a number of the phase encoding by which the same phase encoding gradients are repeatedly applied;
    an averaging means for averaging the multiple echo data obtained at the same phase encoding gradients in accordance with a variable number of averaging, said averaging means comprising an averaging variable means for varying the number of averaging every time of the phase encoding according to a number of applying the phase encoding gradient; and
    a calculating means for calculating a coefficient related to the microscopic motion using the averaged multiple echo data.

2. A magnetic resonance imaging apparatus according to claim 1, wherein said encoding variable means varies in a series the number of the same phase encoding gradient within a first range of the phase encoding gradient around zero more than a second range outside the first range.

3. A magnetic resonance imaging apparatus according to claim 1, wherein said averaging means comprises means for correcting the averaged multiple echo data at a boundary where the number of averaging differs from each other.

4. A magnetic resonance imaging apparatus according to claim 1, wherein said averaging means comprises means for correcting the averaged multiple echo data at a boundary where the number of averaging differs from each other, said correcting means including a weighing function used to correct the averaged multiple echo data.

5. A magnetic resonance imaging apparatus according to claim 3 further comprising a reconstructing means for reconstructing an image of the microscopic motion using the corrected multiple echo data.

6. A magnetic resonance imaging apparatus for quantifying a diffusion in a tissue, comprising:
   a magnet means for applying a static magnetic field to the tissue;
   a gradient coil means for providing a magnetic gradient along a slice selecting direction, a readout direction and a phase encoding direction, the magnetic gradient being superimposed on the static magnetic field;
   an RF coil means for transmitting an RF pulse to the tissue and receiving an echo data from the tissue under an application of the magnetic gradient;
   a sampling means for sampling at least two sets of the echo data;
   a calculating means for calculating a coefficient related to the diffusion using at least two sets of the echo data; and
   a control means for, controlling said gradient coil means to apply a motion probing gradient (MPG) for emphasizing the diffusion and compensating for a predetermined microscopic motion, the MPG being applied in at least one of the slice selecting direction, the readout direction and the phase encoding direction and in at least one set of the echo data.

7. A magnetic resonance imaging apparatus according to claim 6, wherein said calculating means calculates a diffusion coefficient as the coefficient for the tissue using two sets of the echo data which are different from each other and which are acquired respectively using two of the predetermined MPGs, said two of the MPGs being different in gradient factors from each other.

8. A magnetic resonance imaging apparatus according to claim 7, wherein two of the predetermined MPGs are different in at least one of a gradient intensity of the MPGs and an application period of the MPGs.

9. A magnetic resonance imaging apparatus according to claim 6 further comprising means for displaying the calculated diffusion coefficient.

* * * * *

UNITED STATES PATENT AND TRADEMARK OFFICE
CERTIFICATE OF CORRECTION

PATENT NO. : 5,406,947
DATED : April 18, 1995
INVENTOR(S) : Tokunori Kimura

It is certified that error appears in the above-identified patent and that said Letters Patent is hereby corrected as shown below:

In Col. 5, equation beginning on line 27 should read as follows:

$$C(Ne) = \begin{cases} 1 \text{ (when } Ne < Ne1 - \Delta N \text{ or } Ne > Ne1 + \Delta N) \\ [\{fc(Ne1)/f(Ne\ 1^-) - 1\}/\Delta N] \bullet \{Ne - (Ne1 - \Delta N)\} + 1 \\ \quad \text{(when } Ne1 - \Delta N < Ne < Ne1) \\ [\{1 - fc(Ne1)/f(Ne1^+)\}/\Delta N] \bullet (Ne - Ne1) + \\ fc(Ne1)/f(Ne\ 1^+) \\ \quad \text{(when } Ne1 < Ne < Ne1 + \Delta N) \end{cases}$$

Signed and Sealed this

Twenty-fourth Day of March, 1998

Attest:

BRUCE LEHMAN

*Attesting Officer*       *Commissioner of Patents and Trademarks*